United States Patent
Cho et al.

(10) Patent No.: US 7,554,140 B2
(45) Date of Patent: Jun. 30, 2009

(54) NAND-TYPE NON-VOLATILE MEMORY DEVICE

(75) Inventors: Hoo-Sung Cho, Gyeonggi-do (KR);
Soon-Moon Jung, Gyeonggi-do (KR);
Won-Seok Cho, Gyeonggi-do (KR);
Jong-Hyuk Kim, Gyeonggi-do (KR);
Jae-Hun Jeong, Gyeonggi-Do (KR);
Jae-Hoon Jang, Gyeonggi-Do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 93 days.

(21) Appl. No.: 11/651,892

(22) Filed: Jan. 10, 2007

(65) Prior Publication Data

US 2008/0085582 A1    Apr. 10, 2008

(30) Foreign Application Priority Data

Oct. 10, 2006    (KR) ...................... 10-2006-0098583

(51) Int. Cl.
*H01L 31/062* (2006.01)

(52) U.S. Cl. ............... 257/288; 257/777; 257/E29.137; 257/E27.1; 257/E29.117; 257/E21.372; 257/E21.411

(58) Field of Classification Search ................ 257/288, 257/777, E29.137, E27.1, E29.117, E21.372, 257/E21.411

See application file for complete search history.

(56) References Cited

U.S. PATENT DOCUMENTS

| 5,429,968 | A | 7/1995 | Koyama |
| 5,568,421 | A | 10/1996 | Aritome |
| 7,112,815 | B2 | 9/2006 | Prall |
| 2005/0179061 | A1* | 8/2005 | Jang et al. ................... 257/208 |
| 2005/0184292 | A1* | 8/2005 | Kwak et al. .................. 257/70 |
| 2006/0108627 | A1 | 5/2006 | Choi et al. |

FOREIGN PATENT DOCUMENTS

| JP | 05-021758 | 1/1993 |
| JP | 07-249745 | 9/1995 |
| KR | 1996-0005561 | 4/1996 |
| KR | 0159457 | 2/1999 |
| KR | 10-2006-0031490 A | 4/2006 |
| KR | 10-2006-0057821 | 5/2006 |
| KR | 10-2006-0057821 A | 5/2006 |
| KR | 10-2006-0098045 A | 9/2006 |

* cited by examiner

*Primary Examiner*—Thanh V Pham
*Assistant Examiner*—Mohammad T Karimy
(74) *Attorney, Agent, or Firm*—Myers Bigel Sibley & Sajovec, P.A.

(57) ABSTRACT

Provided is a NAND-type nonvolatile memory device and method of forming the same. In the method, a plurality of cell layers are stacked on a semiconductor substrate. Seed contact holes for forming a semiconductor pattern included in a stacked cell are formed at regular distance. At this time, the seed contact holes are arranged such that a bit line plug or a source line pattern is disposed at a center between one pair of seed contact holes adjacent to each other.

15 Claims, 10 Drawing Sheets

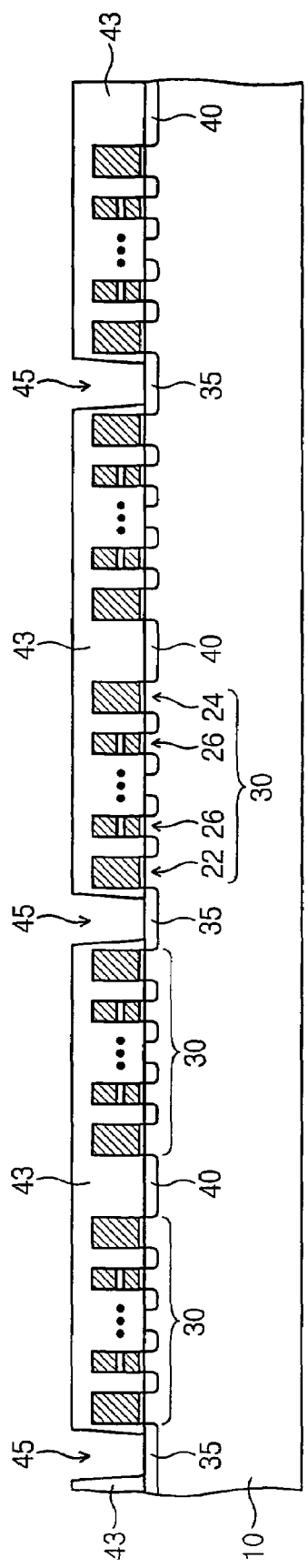

NAND-TYPE NON-VOLATILE MEMORY DEVICE

CROSS-REFERENCE TO RELATED APPLICATIONS

This U.S. non-provisional patent application claims priority under 35 U.S.C. § 119 of Korean Patent Application No. 2006-0098583 filed on Oct. 10, 2006, the entire contents of which are hereby incorporated by reference.

BACKGROUND

The present invention disclosed herein relates to a semiconductor device and method of forming the same, and more particularly, to a NAND-type nonvolatile memory device and method of forming the same.

Nonvolatile memory devices have the property that stored data is maintained even when an external power supply is stopped. A representative of the non-volatile memory devices is a flash memory device that can electrically write and erase data. The flash memory devices can be classified into NOR-type flash memory devices and NAND-type flash memory devices. The NOR-type flash memory devices are widely used in apparatuses requiring a high speed operation because they enables a high speed random access. The NAND-type flash memory devices are widely used as a large capacity storage unit because they have excellent program and erase speed and can easily attain high integration.

As semiconductor devices tend toward high integration, semiconductor manufacturing processes reach limits in reducing a plane area of unit cells of the NAND-type nonvolatile memory device. For example, a photolithography process for defining a line width of a gate included in a unit cell reaches a limit. Also, the semiconductor manufacturing processes reach a limit in securing characteristics necessary for the unit cell according to the reduction in the line width of gate. On the other hand, as semiconductor industries are highly developed, higher capacity NAND-type flash memories are required. In recent years, NAND-type flash memory devices capable of storing tera (T) bits data are required. Accordingly, many researches on methods capable of further increasing the integration density of the NAND-type flash memory devices have been conducted.

SUMMARY

The present invention provides a NAND-type nonvolatile memory device optimized for high integration density, and a method of forming the same.

Also, the present invention provides a NAND-type nonvolatile memory device having superior characteristics due to a smooth flow of operation current and optimized for high integration density, and a method of forming the same.

Embodiments of the present invention provide NAND-type nonvolatile memory devices comprising: first common drains and first common sources disposed alternatively in an active region defined in a semiconductor substrate and extending one direction; a semiconductor pattern disposed on a first insulating layer covering an entire surface of the semiconductor substrate, the semiconductor pattern extending in the one direction and positioned over the active region; second common drains and second common sources disposed alternatively in the semiconductor pattern in the one direction; a second insulating layer covering an entire surface of the semiconductor substrate; a source line pattern continuously penetrating the second insulating layer, the semiconductor pattern and the first insulating layer and connected with the first and second common sources stacked; a bit line plug continuously penetrating the second insulating layer, the semiconductor pattern and the first insulating layer and connected with the first and second common drains stacked; and seed contact structures formed within the first insulating layer, contacting the active region and the semiconductor pattern, and arranged at regular distances in the one direction, wherein the bit line plug or the source line pattern is disposed at a center between the one pair of seed contact structures adjacent to each other.

In some embodiments, the seed contact structures may enclose lower portions of the bit line plugs selected among all the bit line plugs. In this case, the selected bit line plugs may be all the bit line plugs. Unlike this, at least one non-selected bit line plugs may be disposed between the one pair of selected bit line plugs adjacent to each other.

In other embodiments, the seed contact structures may respectively contact lower portions of the source line patterns selected among all the source line patterns. In this case, the selected source line patterns may be all the source line patterns. Unlike this, at least one non-selected source line patterns may be disposed between the one pair of selected bit line plugs adjacent to each other.

In still other embodiments, the seed contact structures may be respectively disposed at centers of the string active regions selected among the string active regions defined as the active region between the first common drain and the first common source, and are shaped in a pillar. In this case, the selected string active regions may be all the string active regions. Unlike this, an even number of non-selected string active regions may be disposed between the one pair of selected string active regions adjacent to each other.

In even other embodiments, the above NAND-type nonvolatile memory device may further include a capping insulating layer covering an entire surface of the semiconductor substrate. In this case, an upper surface of the source line pattern is covered by the capping insulating layer, and the bit line plug extends upward to penetrate the capping insulating layer.

In yet other embodiments, the above NAND-type nonvolatile memory device may further include another cell layer of a single layer or a multi-layer disposed on the second insulating layer. In this case, the another cell layer may include: a second semiconductor pattern disposed on the second insulating layer, extending in the one direction and positioned over the semiconductor pattern; third common drains and third common sources alternatively arranged in the second semiconductor pattern in the one direction; a third cell string formed at the second semiconductor pattern between the third common drain and the third common source adjacent to each other; and a third insulating layer covering an entire surface of the semiconductor substrate. In this case, the bit line plug continuously penetrates the third insulating layer, the second semiconductor pattern, the second insulating layer, the semiconductor pattern and the first insulating layer and is connected with the first, second and third common drains sequentially stacked. Also, the source line pattern continuously penetrates the third insulating layer, the second semiconductor pattern, the second insulating layer, the semiconductor pattern and the first insulating layer and is connected with the first, second and third common sources sequentially stacked. In this case, -the above NAND-type nonvolatile memory device may further include a second seed contact structure disposed within the second insulating layer and contacting the second semiconductor pattern on the seed contact structure.

In other embodiments of the present invention, methods of forming a NAND-type nonvolatile memory device include: forming first common drains and first common sources disposed alternatively in an active region which is defined in a semiconductor substrate and extends one direction; forming a first insulating layer covering an entire surface of the semiconductor substrate; patterning the first insulating layer to form seed contact holes which are arranged at regular distance and expose the active region; forming a seed contact structure filling the seed contact holes and a semiconductor layer disposed on the first insulating layer and contacting the seed contact structure; patterning the semiconductor layer to form a semiconductor pattern which extends in the one direction and is disposed over the active region; forming second common drains and second common sources disposed alternatively in the semiconductor pattern in the one direction; and forming a second insulating layer covering an entire surface of the semiconductor substrate, wherein a grain boundary of the semiconductor layer is positioned at a center between the one pair of seed contact structures adjacent to each other, and is positioned over the first common drain or the second common source.

In even other embodiments of the present invention, the above method may further include forming a source line pattern continuously penetrating the second insulating layer, the semiconductor pattern and the first insulating layer and connected with the first and second common sources stacked; forming a capping insulating layer covering an entire surface of the semiconductor substrate including an upper surface of the source line pattern; and forming a bit line plug continuously penetrating the capping insulating layer, the second insulating layer, the semiconductor pattern and the first insulating layer and connected with the first and second common drains stacked.

In yet other embodiments of the present invention, the seed contact holes may respectively expose the first common drains selected among the first common drains.

In further embodiments of the present invention, the seed contact holes may respectively expose the first common source selected among the first common sources.

In still further embodiments of the present invention, the seed contact holes may respectively expose central portions of the string active regions selected among the string active regions defined as the active region between the first common drain and the first common source adjacent to each other.

BRIEF DESCRIPTION OF THE DRAWINGS

Non-limiting and non-exhaustive embodiments of the present invention will be described with reference to the following figures, wherein like reference numerals refer to like parts throughout the various figures unless otherwise specified. In the figures:

FIGS. 7 through 11 are sectional views for illustrating a method of forming a NAND-type nonvolatile memory device according to another embodiment of the present invention.

DESCRIPTION OF EMBODIMENTS ACCORDING TO THE INVENTION

Figure 1:
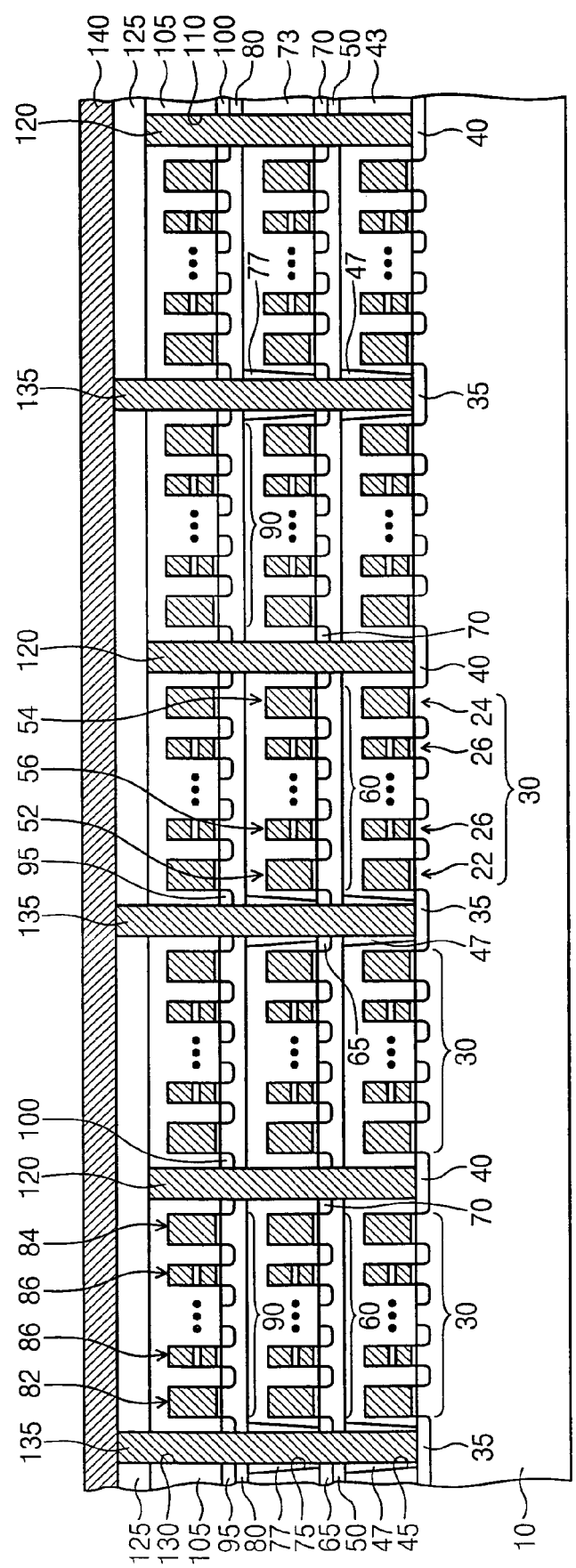
FIG. 1 is a sectional view of a NAND-type nonvolatile memory device according to an embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items. Like numbers refer to like elements throughout.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

FIG. 1 is a plan view of a semiconductor device according to some FIG. 1 is a sectional view of a NAND-type nonvolatile memory device according to an embodiment of the present invention.

Referring to FIG. 1, a plurality of cell layers are stacked on a semiconductor substrate 10. In other words, two or more cell layers can be stacked on the semiconductor substrate 10. In this embodiment, a structure that three cell layers, i.e., first cell layer, second cell layer and third cell layer are sequentially stacked will be described.

First, the first cell layer will be described in detail. The first cell layer includes an active region defined on the semiconductor substrate 10. The active region extends in one direction. The active region is in the form of a line as viewed from a front. First common drains 35 and first common sources 40 are alternatively formed on the active region along the one direction. It is preferable that the first common drains 35 and the first common sources 40 be arranged at regular distances. In other words, it is preferable that a distance between the first common drain 35 and the first common source 40 adjacent to each other be constant. The first common drain 35 and the first common source 40 correspond to dopant doping regions formed in the active region.

The active region between the first common drain 35 and the first common source 40 adjacent to each other is defined as a string active region. One active region includes a plurality of string active regions arranged in the one direction. A first cell string 30 is formed at the string active region. The first cell string 30 includes a plurality of first cell transistors 26 connected in series, and a first string select transistor 22 and a first ground select transistor 24 respectively connected to both ends of the plurality of first cell transistors 26. The first cell strings 30 adjacent to both sides of the first common drain 35 have a symmetric structure to the first common drain 35. Also, the first cell strings 30 adjacent to both sides of the first common source 40 have a symmetric structure to the first common source 40.

The first cell transistor 26 includes a first cell gate line crossing the active region, and a first cell source/drain region formed in the string active region at both sides of the first cell gate line. The first cell gate line includes a first tunnel insulating layer, a first floating gate, a first blocking insulation pattern and a first control gate electrode. The first control gate electrode crosses the string active region, and the first floating gate is interposed between the first control gate electrode and the string active region. The first tunnel insulating layer is interposed between the first floating gate and the string active region, and the first blocking insulation pattern is interposed between the first control gate electrode and the first floating gate. The first tunnel insulating layer can be formed of thermal oxide. The first floating gate can be formed of silicon. The first blocking insulation pattern can be formed of an ONO (oxide-nitride-oxide) layer, an oxide layer thicker than the first tunnel insulating layer, a high dielectric layer (e.g., insulating metal oxide such as hafnium oxide, aluminum oxide or the like) having a higher dielectric constant than the first tunnel insulating layer or the like. The first control gate electrode is formed of a conductive material.

The first string select transistor 22 includes a first string select gate line crossing the string active region. The first common drain 35 corresponds to a drain of the first string select transistor 22, and the first cell source/drain region adjacent to the first string select gate line corresponds to a source of the first string select transistor 22. The first string select gate line includes a first string gate insulating layer and a first string gate electrode sequentially stacked. The first ground select transistor 24 includes a first ground select gate line crossing the string active region. The first common source 40 corresponds to a source of the first ground select transistor 24, and the first cell source/drain region adjacent to the first ground select gate line corresponds to a drain of the first ground select transistor 24. The first ground select gate line includes a first ground select gate insulating layer and a first ground select gate electrode sequentially stacked.

The first insulating layer 43 covers an entire surface of the semiconductor substrate 10. The first insulating layer 43 can be formed of an oxide layer. Of course, the first insulating layer 43 can include an insulating material besides the oxide layer. The first cell layer includes the first common drain 35, the first common source 40, the first cell string 30 and the first insulating layer 43 mentioned above.

Next, the second cell layer disposed on the first cell layer will be described in detail. The second cell layer includes a first semiconductor pattern 50 disposed on the first insulating layer 43. The first semiconductor pattern 50 extends in the aforementioned one direction. It is preferable that the first semiconductor pattern 50 should overlap the active region over the active region. Second common drains 65 and second common sources 70 are alternatively arranged on the first semiconductor pattern 50 in the aforementioned one direction. It is preferable that the second common drains 65 and the second common sources 70 be arranged at regular distances. The second common drains 65 are disposed above the first common drains 35 and overlap the first common drains 35, respectively. Likewise, the second common sources 70 are disposed above the first common sources 40 and overlap the first common sources 40, respectively. It is preferable that the first semiconductor pattern 50 between the second common drain 65 and the second common source 70 adjacent to each other be made of single crystal silicon. The second common drain 65 and the second common source 70 correspond to dopant doping regions formed in the first semiconductor pattern 50.

A second cell string 60 is formed at the first semiconductor pattern 50 between the second common drain 65 and the second common source 70 adjacent to each other. The second cell string 60 includes a plurality of second cell transistors 56 connected in series, and a second string select transistor 52 and a second ground select transistor 54 respectively connected to both ends of the plurality of second cell transistors 56. The second cell strings 60 adjacent to both sides of the second common drain 65 have a symmetric structure to the second common drain 65. Similarly to this, the second cell strings 60 adjacent to both sides of the second common source 70 have a symmetric structure to the second common source 70.

The second cell transistor 56 includes a second cell gate line crossing the first semiconductor pattern 50, and a second cell source/drain region formed in the first semiconductor pattern 50 at both sides of the second cell gate line. The second cell gate line includes a second gate electrode crossing the first semiconductor pattern 50, and a second floating gate interposed between the second control gate electrode and the first semiconductor pattern 50. In addition, the second cell gate line includes a second tunnel insulating layer interposed between the second floating gate and the first semiconductor pattern 50, and a second blocking insulation pattern interposed between the second floating gate and the second control gate electrode. The second tunnel insulating layer, the second floating gate, the second blocking insulation pattern and the second control gate electrode can be formed of the same material.

The second string select transistor 52 includes a second string select gate line crossing the first semiconductor pattern 50. The second common drain 65 corresponds to a drain of the second string select transistor 52, and the second cell source/drain region adjacent to the second string select gate line corresponds to a source of the second string select transistor 52. The second string select gate line includes a second string gate insulating layer and a second string gate electrode sequentially stacked. The second ground select transistor 54 includes a second ground select gate line crossing the string active region. The second common source 70 corresponds to a source of the second ground select transistor 54, and the second cell source/drain region adjacent to the second ground select gate line corresponds to a drain of the second ground select transistor 54. The second ground select gate line includes a second ground select gate insulating layer and a second ground select gate electrode sequentially stacked.

The second insulating layer 73 covers an entire surface of the first semiconductor pattern 50, the second common drain and source 65 and 70, and the second cell strings 60. The second insulating layer 73 can be formed of an oxide layer or a different insulating material. The second cell layer includes the first semiconductor pattern 50, the second common drain 65, the second common source 70, the second cell strings 60 and the second insulating layer 73 mentioned above.

Next, the third cell layer disposed on the second cell layer will be described in detail. The third cell layer includes a second semiconductor pattern 80 disposed on the second insulating layer 73. The second semiconductor pattern 80 extends in the aforementioned one direction. It is preferable that the second semiconductor pattern 80 should overlap the active region and the first semiconductor pattern 50 over the active region and the first semiconductor pattern 50. Third common drains 95 and third common sources 100 are alternatively arranged on the second semiconductor pattern 80 in the aforementioned one direction. It is preferable that the third common drains 95 and the third common sources 100 be arranged at regular distances. In other words, it is preferable that a distance between the third common drain 95 and the third common source 100 adjacent to each other be constant. The third common drains 95 are respectively disposed above the second common drains 65 and overlap the second common drains 65, respectively. The third common sources 100 are disposed above the second common sources 70 and overlap the second common sources 70, respectively. Accordingly, the first common drain 35, the second common drain 65 and the third common drain 95 are sequentially stacked, and the first common source 40, the second common source 70 and the third common source 100 are sequentially stacked. It is preferable that the second semiconductor pattern 80 between the third common drain 95 and the third common source 100 adjacent to each other be made of single crystal silicon. It is preferable that the first to third common drains 35, 65 and 70 and the first to third common sources 40, 70 and 100 be doped with the same dopant.

A third cell string 90 is formed on the second semiconductor pattern 80 between the third common drain 95 and the third common source 100 adjacent to each other. The third cell string 90 includes a plurality of third cell transistors 86 connected in series, and a third string select transistor 82 and a third ground select transistor 84 respectively connected to both ends of the plurality of third cell transistors 86. The third cell strings 90 adjacent to both sides of the third common drain 95 have a symmetric structure to the third common drain 95. Similarly to this, the third cell strings 90 adjacent to both sides of the third common source 100 have a symmetric structure to the third common source 100.

The third string select transistor 82, the third cell transistor 86, and the third ground select transistor 84 can have the same construction as the second string select transistor 52, the second cell transistor 56, and the second ground select transistor 54, respectively. In concrete, the third cell transistor 86 includes a third cell gate line crossing the second semiconductor pattern 80, and a third cell source/drain region formed in the second semiconductor pattern 80 at both sides of the third cell gate line. The third cell gate line includes a third gate electrode crossing the second semiconductor pattern 80, and a third floating gate interposed between the third control gate electrode and the second semiconductor pattern 80. In addition, the third cell gate line includes a third tunnel insulating layer interposed between the third floating gate and the second semiconductor pattern 80, and a third blocking insulation pattern interposed between the third floating gate and the third control gate electrode. The third tunnel insulating layer, the third floating gate, the third blocking insulation pattern and the third control gate electrode can be formed of the same material as the second tunnel insulating layer, the second floating gate, the second blocking insulation pattern and the second control gate electrode.

The third string select transistor 82 includes a third string select gate line crossing the second semiconductor pattern 80. The third common drain 95 corresponds to a drain of the third string select transistor 82, and the third cell source/drain region adjacent to the third string select gate line corresponds to a source of the third string select transistor 82. The third string select gate line includes a third string gate insulating layer and a third string gate electrode sequentially stacked. The third ground select transistor 84 includes a third ground select gate line crossing the second semiconductor pattern 80. The third common source 100 corresponds to a source of the third ground select transistor 84, and the third cell source/drain region adjacent to the third ground select gate line corresponds to a drain of the third ground select transistor 84. The third ground select gate line includes a third ground select gate insulating layer and a third ground select gate electrode sequentially stacked.

The third insulating layer 105 covers an entire surface of the second semiconductor pattern 80, the third common drain and source 95 and 100, and the third cell strings 90. The third insulating layer 105 can be formed of an oxide layer or a different insulating material. The third cell layer includes the second semiconductor pattern 80, the third common drain 95, the third common source 100, the third cell strings 90 and the third insulating layer 105 mentioned above.

A source line pattern 120 fills a source groove 110. The source groove 110 penetrates the third insulating layer 105, the second semiconductor pattern 80, the second insulating layer 73, the first semiconductor pattern 50 and the first insulating layer 43. At this time, the source groove 110 allows an upper surface of the first common source 40, a side surface of the second common source 70 and a side surface of the third common source 100 to be exposed. Accordingly, the source line pattern 120 is electrically connected with the first, second and third common sources 40, 70 and 100. The source groove 110 crosses the active region, the first semiconductor pattern 50 and the second semiconductor pattern 80. Accordingly, the first and second semiconductor patterns 50 and 80 are separated by the source line pattern 120. An upper surface of the source line pattern 120 is coplanar to an upper surface of the third insulating layer 105.

A capping insulating layer 125 covers an entire surface of the semiconductor substrate 10 including the upper surface of the source line pattern 120. The capping insulating layer 125 can be formed of oxide or other insulating material.

A bit line plug 135 fills a bit line contact hole 130. The bit line contact hole 130 continuously penetrates the capping insulating layer 125, the third insulating layer 105, the second semiconductor pattern 80, the second insulating layer 73, the first semiconductor pattern 50 and the first insulating layer 43. The bit line contact hole 130 allows an upper surface of the first common drain 35, a side surface of the second common drain 65 and a side surface of the third common drain 95 stacked to be exposed. Accordingly, the bit line plug 135 contacts the first, second and third common drains 35, 65 and 95 stacked. The bit line plug 135 is also formed of a conducting material. A bit line 140 is disposed on the capping insulating layer 125. The bit line 140 is connected with an upper surface of the bit line plug 135 and is parallel to the active region and the semiconductor patterns 50 and 80. The bit line 140 can overlap the active region and the semiconductor patterns 50 and 80.

First seed contact structures 47 are disposed within the first insulating layer 43. At this time, it is preferable that the first seed contact structures 47 be arranged at regular distances. At this time, as shown in FIG. 1, the source line pattern 120 and the first common source 40 can be disposed at a center between one pair of first seed contact structures 47 adjacent to each other. In other words, it is preferable that a distance between the source line pattern 120 and one of one pair of first seed contact structures 47 adjacent to each other be equal to a distance between the source line pattern 120 and the other of one pair of first seed contact structures 47 adjacent to each other.

The first seed contact structure 47 is disposed within a first seed contact hole 45 penetrating the first insulating layer 43. It is preferable that the first seed contact structure 47 be in a form enclosing a lower portion of the bit line plug 135. In other words, the first seed contact structure 47 is shaped in a tube. In particular, the first seed contact structure 47 may be shaped in a cylinder. As shown in FIG. 1, the first seed contact structure 47 can be disposed on each of the lower portions of all the bit line plugs 135. The first seed contact structure 47 contacts the lower portion of the bit line plug 135. The first seed contact structure 47 contacts the active region and the first semiconductor pattern 50. In particular, the first seed contact structure 47 contacts the first common drain 35. It is preferable that the first seed contact structure 47 be made of single crystal silicon.

The first semiconductor pattern 50 is comprised of single crystal portions formed from each of the first seed contact structures 47 acting as a seed for crystal growth. The single crystal portions are preferably formed of silicon. At this time, as aforementioned, the source line pattern 120 is disposed at the center between the one pair of first seed contact structures 47 adjacent to each other. Accordingly, the single crystal portions having each of the one pair of first seed contact structures 47 adjacent to each other as a growth start point contact one another at a position where the source line pattern 120 is formed, and thus a grain boundary is formed. As a result, the first semiconductor pattern 50 between the second common drain 65 and the second common source 70 adjacent to each other is made of single crystal pure silicon alone. The grain boundary may hinder a current flow. Since the grain boundary does not exist within the first semiconductor pattern 50 where the second cell string 60 is formed, the second cell string 60 can maintain superior characteristics. By positioning the grain boundary at the portion where the source line pattern 120 is positioned and forming the source line pattern 120 to remove the grain boundary, a NAND-type nonvolatile memory device with superior characteristics can be realized. Also, as aforementioned, by stacking a plurality of cell layers, a NAND-type nonvolatile memory device with a high integration density can be realized.

Second seed contact structures 77 are disposed within the second insulating layer 73 above the first seed contact structures 47. Each of the second seed contact structure 77 is disposed within a second seed contact hole 75 penetrating the second insulating layer 73. The second seed contact structure 75 has a structure enclosing a sidewall of a portion of the bit line plug positioned within the second insulating layer 73. The second seed contact structure 77 contacts the first and second semiconductor patterns 50 and 80, and is made of single crystal silicon. The second semiconductor pattern 80 is made of a second single crystal silicon which uses each of the second seed contact structures 77 as a seed. Like in the first semiconductor pattern 50, the grain boundary of the second single crystal silicon is disposed at a portion where the source line pattern 120 is positioned. Accordingly, the second semiconductor pattern 80 in which the third cell string 90 is formed can be made of pure single crystal silicon not having a grain boundary. As a result, the third cell strings 90 can maintain superior characteristics.

As aforementioned, the first seed contact structure 47 can be disposed on the lower portion of each of all the bit line plugs 135. Unlike this, the first seed contact structure 47 may be disposed on the lower portion of each of some selected among the bit line plugs 135, which will be described with reference to FIG. 2.

Figure 2:
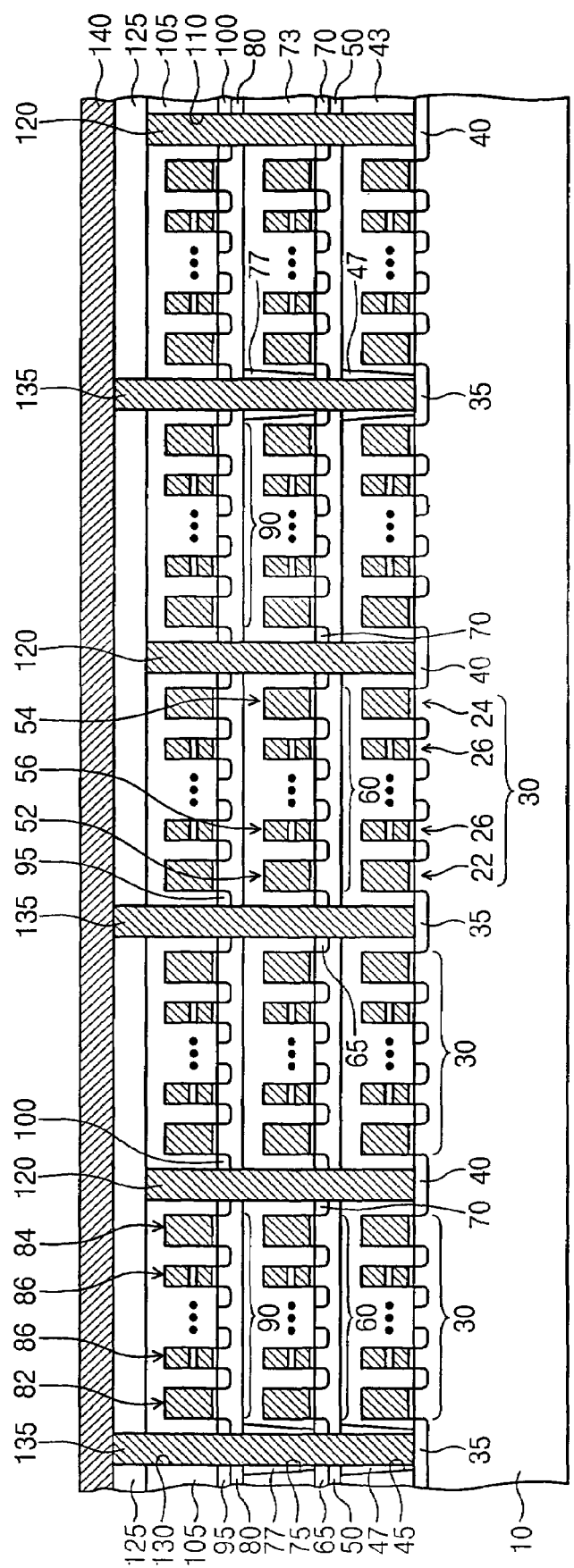
FIG. 2 is a sectional view of a modified example of a NAND-type nonvolatile memory device according to an embodiment of the present invention.

FIG. 2 is a sectional view of a modified example of a NAND-type nonvolatile memory device according to an embodiment of the present invention.

Referring to FIG. 2, first seed contact structures 47 enclose lower portions of the bit line plugs 135 selected among the bit line plugs 135, respectively. In this case, the first seed contact structures 47 are arranged at regular distance in the one direction. At least one non-selected bit line plugs are disposed between the one pair of selected bit line plugs adjacent to each other. In case where an odd number of non-selected bit line plugs 135 exist between the one pair of selected bit line plugs adjacent to each other, the non-selected bit line plug is disposed at a center between the one pair of selected bit line plugs adjacent to each other. At this time, a grain boundary is disposed at a region where the central non-selected bit line plug is positioned. As a result, the first semiconductor pattern 50 in which the second cell string 60 is formed can be made of pure single crystal silicon not having a grain boundary. Unlike this, in case where an even number of non-selected bit line plugs 135 exist between the one pair of selected bit line plugs adjacent to each other, the source line pattern 120 is disposed at a center between the one pair of selected bit line plugs adjacent to each other.

Next, a NAND-type nonvolatile memory device according to another embodiment of the present invention will be described with reference to FIG. 3. The present embodiment is characterized in that the seed contact structures are disposed at different positions than those in the aforementioned embodiment. In the present embodiment, like reference numerals in the drawings denote like elements.

Figure 3:
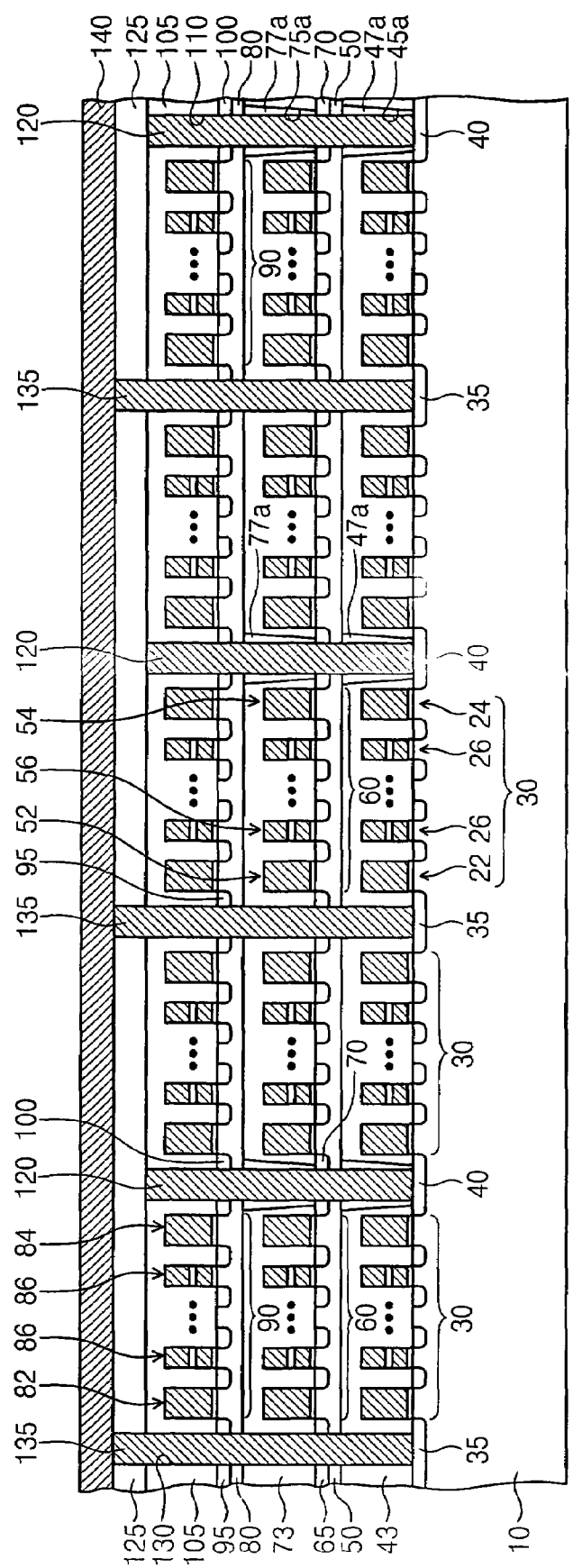
FIG. 3 is a sectional view of a NAND-type nonvolatile memory device according to another embodiment of the present invention.

FIG. 3 is a sectional view of a NAND-type nonvolatile memory device according to another embodiment of the present invention.

Referring to FIG. 3, first seed contact structures 47a are arranged at regular distances in the one direction in a first insulating layer 43. The first seed contact structure 47a is disposed within a first seed contact hole 45a penetrating the first insulating layer 43, and contacts a lower sidewall of the source line pattern 120. In other words, the source line pattern 120 crosses the first seed contact hole 45a. The first seed contact structure 47a contacts the active region and the first semiconductor pattern 50. In particular, the first seed contact structure 47a contacts a first common source 40. A bit line plug 135 is disposed at a center between the one pair of first seed contact structures 47a adjacent to each other. Accordingly, a grain boundary of a first single crystal silicon layer constituting the first semiconductor pattern 50 is formed at a region where the bit line plug is positioned. The first seed contact structure 47 can be disposed at each of the lower portions of all the source line patterns 120. A second seed contact structure 77a is disposed in a second insulating layer 73 on the first seed contact structure 47a. The second seed contact structure 77a is disposed within a second seed contact hole 75a penetrating the second insulating layer 73. The second seed contact structure 77a contacts a sidewall of a portion penetrating the second insulating layer 73 of the source line pattern 120. The source line pattern 120 is also disposed at a center between the one pair of second seed contact structures 77a adjacent to each other.

The first seed contact structures 47a may be disposed so as to contact some selected among the source line patterns 120, which will be described with reference to FIG. 4.

Figure 4:
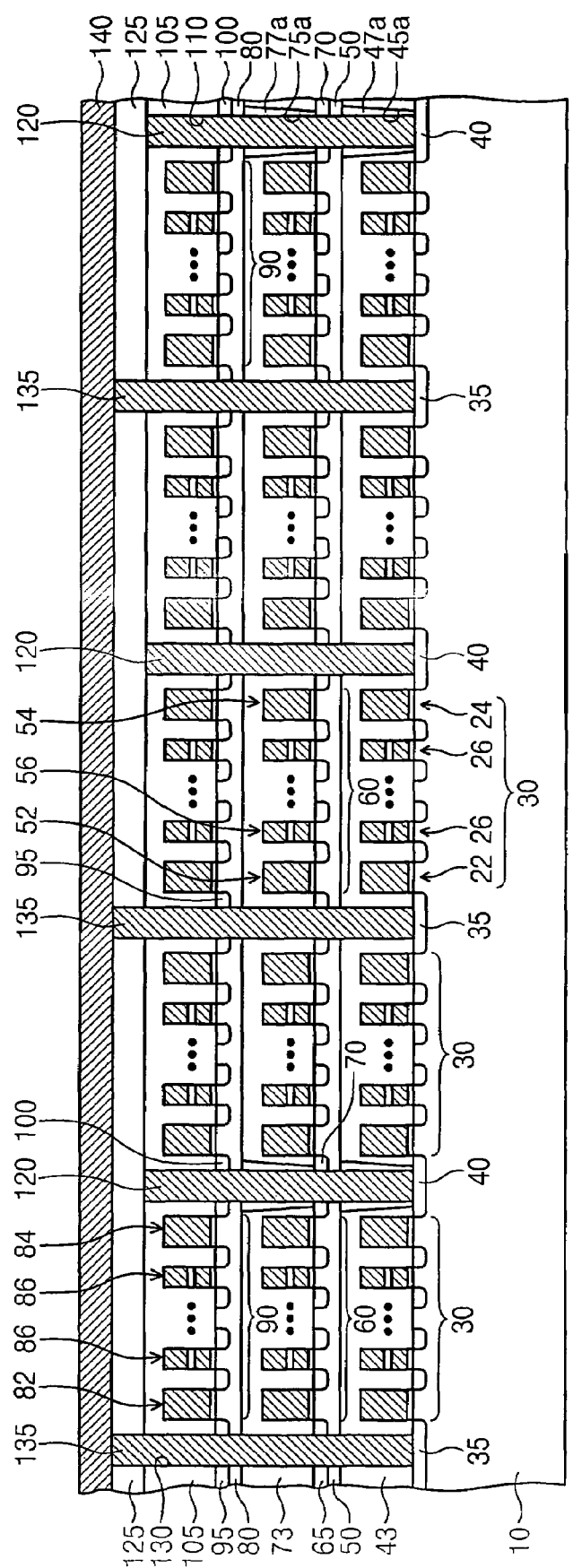
FIG. 4 is a sectional view of a NAND-type nonvolatile memory device according to another embodiment of the present invention.

FIG. 4 is a sectional view of a NAND-type nonvolatile memory device according to another embodiment of the present invention.

Referring to FIG. 4, the first seed contact structures 47a can contact the lower portions of the source line patterns 120 selected among the source line patterns 120. In other words, the first seed contact holes 45a can respectively expose common sources 40 selected among the first common sources 40. At least one non-selected source line pattern 120 can be disposed between the one pair of selected source line patterns 120 adjacent to each other. In case where an odd number of non-selected source line pattern 120 is disposed between the one pair of selected source line patterns 120 adjacent to each other, the non-selected source line pattern 120 is disposed at a center between the one pair of selected source line patterns 120 adjacent to each other. Unlike this, in case where an even number of non-selected source line patterns 120 is disposed between the one pair of selected source line patterns adjacent to each other, a bit line plug 135 is positioned at a center between the one pair of selected source line patterns 120 adjacent to each other.

Next, another arrangement of seed contact structures will be described with reference to FIG. 5.

Figure 5:
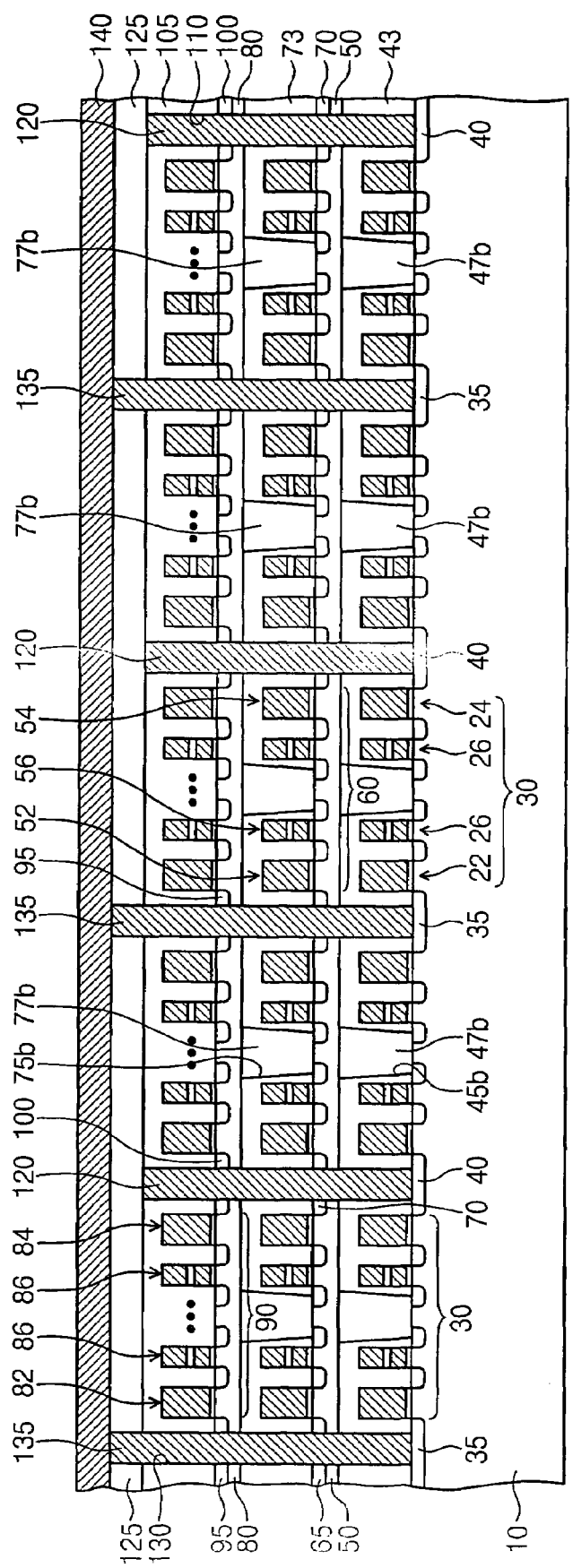
FIG. 5 is a sectional view of a NAND-type nonvolatile memory device according to another embodiment of the present invention.

FIG. 5 is a sectional view of a NAND-type nonvolatile memory device according to another embodiment of the present invention.

Referring to FIG. 5, first seed contact structures 47b are arranged at regular distances in a first insulating layer 43. At this time, the first seed contact structure 47a fills a first seed contact hole 45b exposing a center of the string active region. The first seed contact structure 47b is shaped in a pillar. The first seed contact structure 47b contacts the active region and the first semiconductor pattern 50. A bit line plug 135 or a source line pattern 120 is disposed at a center between the one pair of first seed contact structures 47b adjacent to each other. A second seed contact structure 77b is disposed within a second insulating layer 73 on the first seed contact structure 47b. The second seed contact structure 77b fills a second seed contact hole 75b penetrating the second insulating layer 73. The second seed contact structure 77b contacts first and second semiconductor patterns 50 and 80. The bit line plug 135 or the source line pattern 120 is disposed at a center between the one pair of second seed contact structures 77b adjacent to each other. As shown in FIG. 5, the first seed contact structure 47b can be disposed at centers of all the string active regions.

Unlike this, the first seed contact structure 47b may be respectively disposed at centers of some selected among the string active regions, which will be described with reference to the accompanying drawings.

Figure 6:
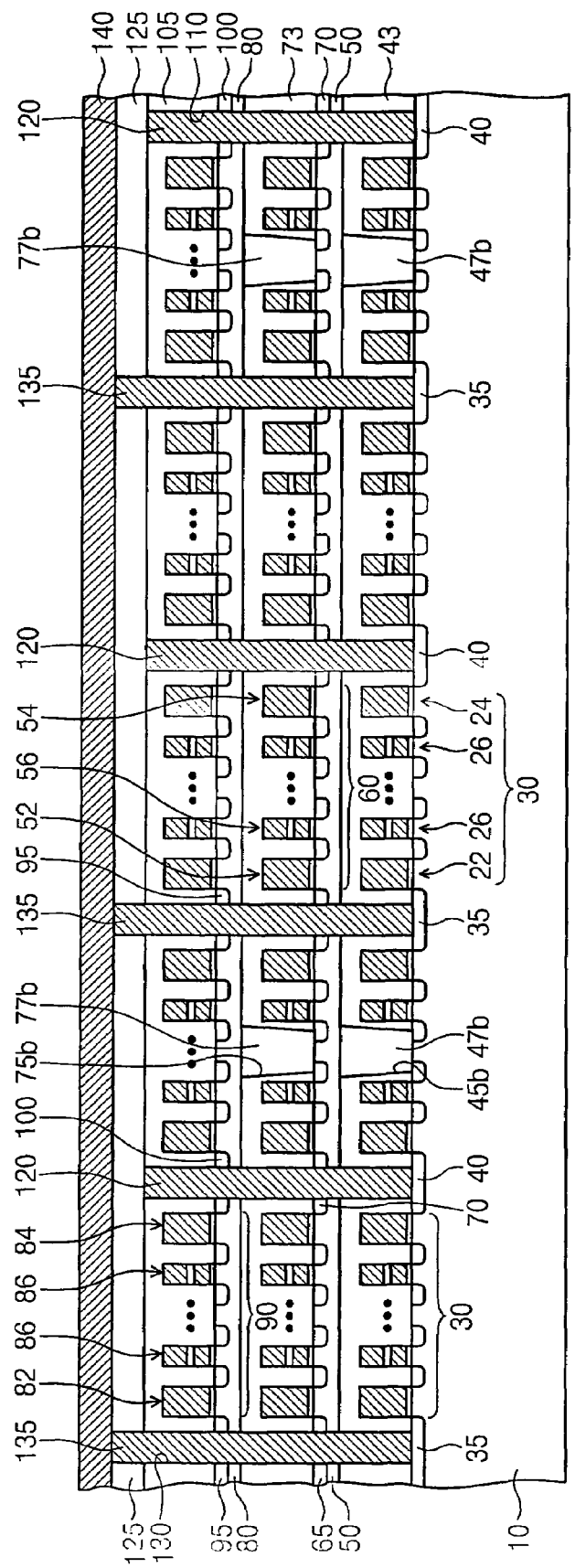
FIG. 6 is a sectional view of a modified example of a NAND-type nonvolatile memory device according to another embodiment of the present invention.

FIG. 6 is a sectional view of a modified example of a NAND-type nonvolatile memory device according to another embodiment of the present invention.

Referring to FIG. 6, the first seed contact structure 47b respectively contacts centers of the string active regions selected among the string active regions. At this time, it is preferable that an even number of non-selected string active regions be disposed between the one pair of selected string active regions. Accordingly, the bit line plug 135 or the source line pattern 120 can be disposed at a center between the one pair of first seed contact structures 47b.

For example, in case where an odd number of non-selected string active regions is disposed between the one pair of selected string active regions, a central portion of non-selected string active region is positioned at a center between the one pair of first seed contact structures 47b. Accordingly, a grain boundary exists at the first semiconductor pattern 50 within the second cell string 60, so that the characteristic of the second cell string 60 may be degenerated.

In the aforementioned embodiments, it is preferable that the first seed contact structures 47, 47a, 47b be made of single crystal silicon. It is also preferable that the second seed contact structures 77, 77a, 77b be made of single crystal silicon.

FIGS. 7 through 11 are sectional views for illustrating a method of forming a NAND-type nonvolatile memory device according to another embodiment of the present invention.

Referring to FIG. 7, a device isolation layer (not shown) is formed in a semiconductor substrate 10 to define an active region extending in one direction. First common drains 35 and first common sources 40 arranged in the one direction are alternately formed in the active region. A plurality of first cell strings 30 arranged in the one direction are formed on the active region. A description for a structure of the first cell string 30 is the same as the above description made with reference to FIG. 1. As illustrated in FIG. 1, an active region between a first common drain 35 and a first common source 40 is defined as a string active region. The active region includes a plurality of string active regions arranged in the one direction.

A method of forming the first common drains 35, the first common sources 40 and the first cell strings 40 will now be described in detail. A first string select gate line, a plurality of first cell gate lines and a first ground select gate line which cross the active region in parallel to one another are formed. Dopant ions are implanted using the first string select, first cell, and first ground select gate lines as a mask, thereby forming first cell source/drain regions, the first common drains 35 and the first common sources 40 in the active region.

A first insulating layer 43 is formed on an entire surface of the semiconductor substrate 10. Before forming the first insulating layer 43, an etch stop layer (not shown) may be conformally formed to cover an entire surface of the semiconductor substrate 10.

The first insulating layer 43 is patterned to form first seed contact holes 45 exposing the active region. It is preferable that the first seed contact holes 45 be arranged at regular distances in the one direction. When the first seed contact holes 45 expose the respective first common drains, the NAND-type nonvolatile memory device of FIG. 1 can be realized. Alternatively, when the first seed contact holes 45 expose portions selected among the first common drains 35, the NAND-type nonvolatile memory device of FIG. 2 can be realized.

Alternatively, as illustrated in FIGS. 3 and 4, when the first seed contact holes 45 expose all the first common drains 35 or the portions selected among the first common drains 35, the NAND-type nonvolatile memory device of FIGS. 3 and 4 can be realized. Alternatively, when the first seed contact holes 45 expose central portions of string active regions respectively, or expose central portions of some of the string active regions, the NAND-type nonvolatile memory device of FIGS. 5 and 6 can be realized. Hereinafter, a method of forming the NAND-type nonvolatile memory device of FIG. 1 will be described below.

Referring to FIG. 8, a first seed contact structure 47 filling the first seed contact hole 45 is formed, and a first semiconductor layer disposed on the first insulating layer 43 is then formed. The first semiconductor layer 43 is patterned to form a first semiconductor pattern 50 extending in the one direction. The first semiconductor pattern 50 is in contact with the seed contact structure 47, and overlaps the active region.

Preferably, the seed contact structure 47 is formed of single crystal silicon. It is preferable that the first semiconductor layer be comprised of a plurality of single crystal portions formed of silicon. At this time, a grain boundary between the first single crystal portions is disposed over the first common source 40. Along the arrangement of the first seed contact holes 45, the grain boundary may be disposed over the first common drain region.

One method of forming the seed contact structure 47 and the first conductive layer will be specifically described below. First, a selective epitaxial growth is performed on the semiconductor substrate 10 having the active region exposed to the first seed contact hole 45, thereby forming the first seed contact structure 47 filling the first seed contact hole 45. Subsequently, an amorphous silicon layer contacting the first seed contact structure 47 is formed on the first insulating layer 43. Thereafter, a solid phase epitaxial (SPE) process is performed on the semiconductor substrate 10. The SPE process may include a thermal treatment process. Portions of the amorphous silicon layer contacting the first seed contact structures 47 are changed into singe crystal silicon from each of the first seed contact structures 47 as a start point. Accordingly, the first single crystal portions are grown from each of the first seed contact structures 47 on which the SPE process is performed. The first single crystal portions are in contact with each other over the first common source 40 at a center between one pair of adjacent first seed contact structures 47, and thus a grain boundary is formed. As a result, the grain boundary in the first semiconductor pattern 50 is disposed over the first common source 40.

Meanwhile, the first seed contact structure 47 and the first semiconductor layer may be formed using another method. Specifically, the selective epitaxial growth is performed on the semiconductor substrate 10 having the active region exposed to the first seed contact holes 47 to form an epitaxial growth layer. The epitaxial growth layer fills the first seed contact hole 47 and also covers an entire surface of the first insulating layer 43. Portions of the epitaxial growth layer grown from the respective first seed contact holes 47 are in contact with each other over the first common source 40, and thus a grain boundary is formed. Thereafter, a upper surface of the epitaxial growth layer is planarized. A portion of the planarized epitaxial growth layer that fills the first seed contact hole 45 corresponds to the first seed contact structure 47, and a portion of the planarized epitaxial growth layer disposed on the first insulating layer 43 corresponds to the first semiconductor layer.

Figure 9:
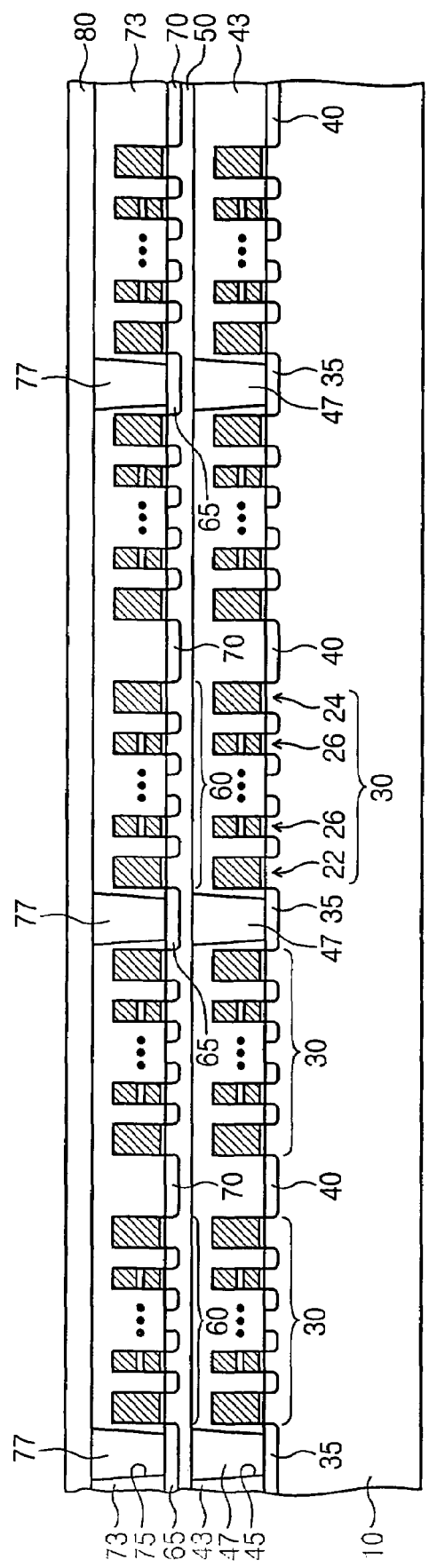

Referring to FIG. 9, second common drains 65 and second common sources 70 are formed in the first semiconductor pattern 50 such that they are alternately arranged in the one direction. A second cell string 60 is formed on the first semiconductor pattern 50 between the second common drain 65 and the common source which are adjacent to each other.

A method of forming the second cell string 60, the second common drains 65 and the second common sources 70 will be described in detail. A second string select gate line, a plurality of second cell gate lines and a second ground select gate line which cross the first semiconductor pattern 50 are formed. Thereafter, dopant ions are implanted using the second string select, second cell, and second ground select gate lines as a mask, thereby forming second common source/drain regions 65 and 70, a second cell source/drain region. The second common drains 65 overlap the first common drains 35, respectively, and the second common sources 70 overlap the first common sources 40, respectively.

A second insulating layer 73 covering an entire surface of the semiconductor substrate 10 is formed. The second insulating layer 73 is patterned to form second seed contact holes 75 exposing the respective second common drains 65. It is preferable that the second seed contact holes 75 be formed over the first seed contact structures 47. The second seed contact holes 75 are also arranged at regular distances in the one direction.

Second seed contact structures 77 filling each of the second seed contact holes 75 is formed, and a second conductive layer disposed on the second insulating layer 73 is then formed. The second semiconductor layer is patterned to form a second semiconductor pattern 80 extending in the one direction. The second semiconductor pattern 80 overlaps the active region and the first semiconductor pattern 50.

The second seed contact structures 77 are formed of single crystal silicon, and the second semiconductor layer is formed from a plurality of second single crystal portions made of silicon. Here, a grain boundary formed by contacting neighboring second single crystal portions is disposed over the second common source 70. When the first and second seed contact holes 45 and 75 are differently arranged as mentioned above, the grain boundary between the second single crystal portions may be disposed over the second common drain 65.

The seed contact structures 77 and the second semiconductor layer can be formed using one method of forming the first seed contact structures 47 and the first semiconductor layer (method including the selective epitaxial growth, the process of forming the amorphous silicon and the planarization process) or another forming method (method including the selective epitaxial growth and the planarization process).

Figure 10:
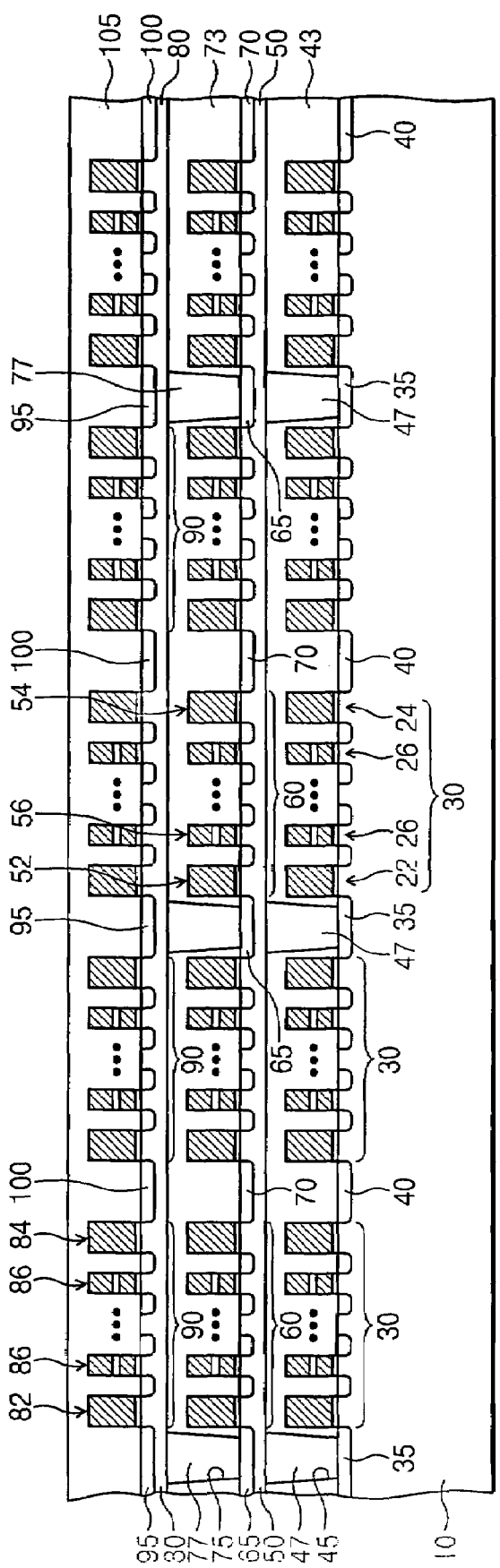

Referring to FIG. 10, third common drains 95, third common sources 100 and third cell strings 90 are formed on the second semiconductor pattern 80, wherein the third common drains 95 and third common sources 100 are alternately arranged in the one direction. Specifically, a third string select gate line, a plurality of third cell gate lines and a third ground select gate line which cross the second semiconductor pattern 80 are formed. Dopant ions are implanted using the third string select, the plurality of third cell and third ground select gate lines as a mask, thereby forming a third cell source/drain region, third common drains and sources 95 and 100. A third insulating layer 105 is formed on entire surface of the semiconductor substrate 10.

Figure 11:
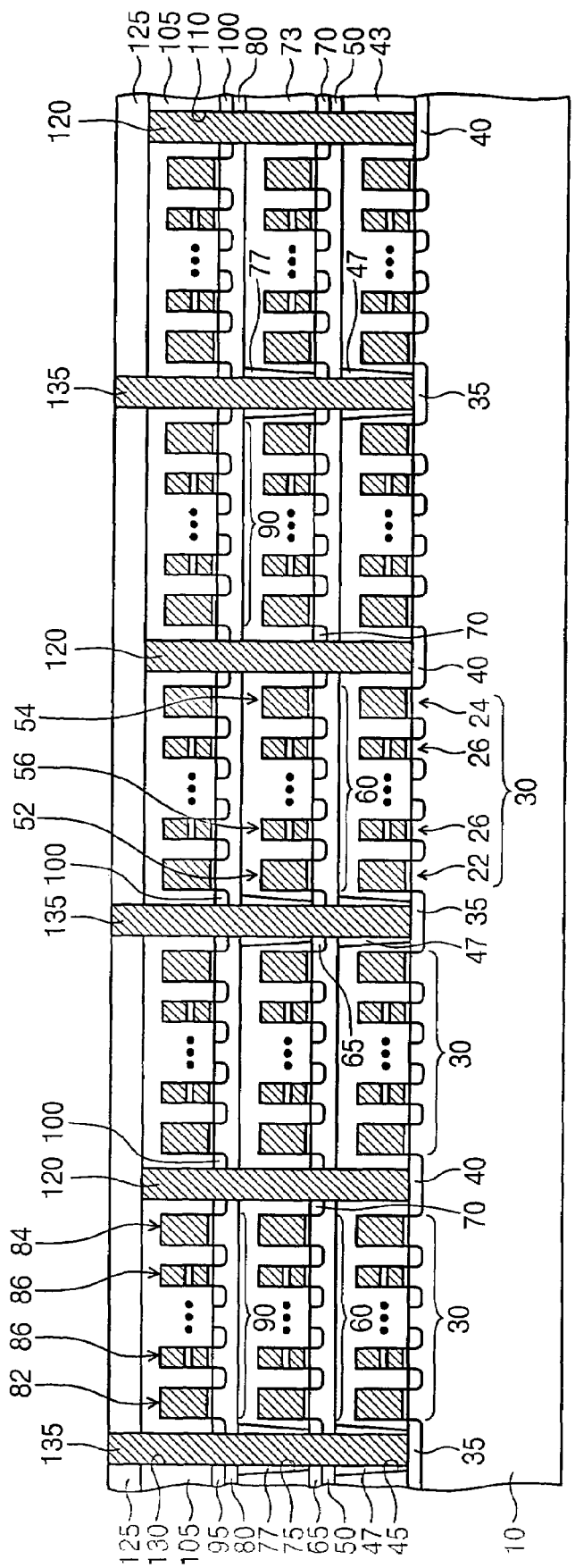

Referring to FIG. 11, the third insulating layer 105, the second semiconductor pattern 80, the second insulating layer 73, the first semiconductor pattern 50 and the first insulating layer 43 are successively patterned to form a source groove 110 exposing a upper surface of the first common source 40. The source groove 110 also exposes a side surface of the second common source 70 and a side surface of the third common source 100 which are stacked over the first common source 40. The source groove 110 crosses the active region, the first semiconductor pattern 50 and the second semiconductor pattern 80. When forming the source groove 110, an etch stop layer (not shown) may be used, which is formed before forming the first insulating layer 43. When forming the first insulating layer 43, the grain boundary in the second and first semiconductor patterns 80 and 50 is removed. Accordingly, it is possible to realize the NAND-type nonvolatile memory device having excellent property. A first conductive layer is formed to fill the source groove 110. The first conductive layer is planarized until the third insulating layer 105 is exposed, and thus a source line pattern 120 is formed.

Subsequently, a capping insulating layer 125 is formed covering the semiconductor substrate 10. The capping insulating layer 125 covers the upper surface of the source line pattern 120. Afterward, a bit line contact hole 130 is formed, which successively penetrates the capping insulating layer 125, the third insulating layer 105, the second semiconductor pattern 80, the second insulating layer 73, the first semiconductor pattern 50 and the first insulating layer. The bit line contact hole 130 exposes the upper surface of the first common drain 35, the side surface of the second common drain 65, and the side surface of the third common drain 95. The first seed contact structure 47 and the second seed contact structure 77, which are stacked in sequence, may be etched when forming the bit line contact hole 130. At this time, the bit line contact hole 130, the contact hole 130 may penetrate the second and first seed contact structures 77 and 47. Alternatively, by forming the bit line contact hole 130 such that its diameter is greater than those of the second and first seed contact holes 75 and 45, both the second and first seed contact structures 77 and 47 may be removed when forming the bit line contact hole 130.

Likewise, as illustrated in FIG. 3 and/or FIG. 4, in case that the second and first seed contact holes overlap the source groove 110, the source groove 110 may penetrate the second and first seed contact structures (see reference numerals 77a and 47a of FIG. 3 and/or FIG. 4) when forming the source groove 110. Alternatively, both the second and first seed contact structures (see reference numerals 77a and 47a of FIG. 3 and/or FIG. 4) may be removed when forming the source groove 110.

Referring again to FIG. 11, a second conductive layer is formed to fill the bit line contact hole 130. The second conductive layer is planarized until the capping insulating layer 125 is exposed, and thus a bit line plug 135 is formed. Thereafter, a bit line, which has been described in FIGS. 1 through 6, is formed on the capping insulating layer 125.

As described above, according to the present invention, a plurality of cell layers are stacked for realizing high integration. In addition, seed contact holes for forming a semiconductor pattern included in the stacked cell are formed such that they are arranged at regular distances. At this time, the seed contact holes are arranged such that a bit line plug or a source line pattern is disposed at a center between one pair of adjacent seed contact holes. Accordingly, a grain boundary of the semiconductor pattern can be disposed in a region where the source line pattern or the bit line plug exists. Resultantly, the semiconductor pattern between the bit line plug and the common source pattern which are adjacent to each other can be formed of pure single crystal semiconductor Consequently, it is possible to realize a highly integrated NAND-type nonvolatile memory device having excellent property by preventing the hindrance of current flow, which may caused by the grain boundary.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed:

1. A NAND-type nonvolatile memory device comprising:
   first common drains and first common sources disposed alternatively in an active region, the active region defined in a semiconductor substrate and extending in at least one direction;
   a semiconductor pattern disposed on a first insulating layer, the semiconductor pattern extending in the at least one direction and positioned over the active region;
   second common drains and second common sources disposed alternatively in the semiconductor pattern in the at least one direction;
   a second insulating layer covering the semiconductor substrate;
   a source line pattern continuously penetrating the second insulating layer, the semiconductor pattern and the first insulating layer and connected to the first and second common sources;
   a bit line plug continuously penetrating the second insulating layer, the semiconductor pattern and the first insulating layer and connected to the first and second common drains; and
   seed contact structures formed within the first insulating layer, contacting the active region and the semiconductor pattern, and arranged at regular spacing in the at least one direction, wherein the bit line plug or the source line pattern is disposed at a center between separate seed contact structures that are immediately adjacent to each other.

2. The NAND-type nonvolatile memory device of claim 1, wherein the seed contact structures enclose lower portions of the bit line plug.

3. The NAND-type nonvolatile memory device of claim 2, wherein the selected bit line plugs comprise all of the bit line plug.

4. The NAND-type nonvolatile memory device of claim 2, wherein at least one non-selected bit line plug is disposed between the pair of bit line plug immediately adjacent to each other.

5. The NAND-type nonvolatile memory device of claim 1, wherein the seed contact structures respectively contact lower portions of the source line patterns.

6. The NAND-type nonvolatile memory device of claim 5, wherein the selected source line patterns comprise all of the source line patterns.

7. The NAND-type nonvolatile memory device of claim 5, wherein at least one source line pattern is disposed between a pair of bit line plugs immediately adjacent to each other.

8. The NAND-type nonvolatile memory device of claim 1, wherein the seed contact structures are respectively disposed at centers of string active regions selected among the string active regions defined as the active region between the first common drain and the first common source immediately adjacent to each other, and are shaped in a pillar.

9. The NAND-type nonvolatile memory device of claim 8, wherein the selected string active regions are all the string active regions.

10. The NAND-type nonvolatile memory device of claim 8, wherein an even number of non-selected string active region are disposed between the pair of selected string active regions adjacent to each other.

11. The NAND-type nonvolatile memory device of claim 1, further comprising:
   a first cell string formed at the active region between the first common drain and the first common source adjacent to each other; and a second cell string formed at the semiconductor pattern between the second common drain and the second common source adjacent to each other, wherein the first cell string comprises a plurality of first cell transistors connected in series, and a first string select transistor and a first ground select transistor respectively connected to both ends of the plurality of first cell transistors, and the second cell string comprises a plurality of second cell transistors connected in series, and a second string select transistor and a second ground select transistor respectively connected to both ends of the plurality of second cell transistors.

12. The NAND-type nonvolatile memory device of claim 1, further comprising a capping insulating layer covering an entire surface of the semiconductor substrate, wherein an upper surface of the source line pattern is covered by the capping insulating layer, and the bit line plug extends upward to penetrate the capping insulating layer.

13. The NAND-type nonvolatile memory device of claim 1, further comprising another cell layer of a single layer or a multi-layer disposed on the second insulating layer, wherein the another cell layer comprises: a second semiconductor pattern disposed on the second insulating layer, extending in the one direction and positioned over the semiconductor pattern; third common drains and third common sources alternatively arranged in the second semiconductor pattern in the one direction; a third cell string formed at the second semiconductor pattern between the third common drain and the third common source adjacent to each other; and a third insulating layer covering an entire surface of the semiconductor substrate, the bit line plug continuously penetrates the third insulating layer, the second semiconductor pattern, the second insulating layer, the semiconductor pattern and the first insulating layer and is connected with the first, second and third common drains sequentially stacked, and the source line pattern continuously penetrates the third insulating layer, the second semiconductor pattern, the second insulating layer, the semiconductor pattern and the first insulating layer and is connected with the first, second and third common sources sequentially stacked.

14. The NAND-type nonvolatile memory device of claim 13, further comprising a second seed contact structure disposed within the second insulating layer and contacting the second semiconductor pattern on the seed contact structure.

15. The NAND-type nonvolatile memory device of claim 1, further comprising:

a top insulating layer covering the source line patterns; and a bit line disposed on the top insulating layer and electrically connected to the bit line plug.

* * * * *